United States Patent
Sun et al.

(10) Patent No.: US 11,705,920 B2
(45) Date of Patent: Jul. 18, 2023

(54) PASSIVE NOISE-SHAPING SUCCESSIVE APPROXIMATION REGISTER ANALOG-TO-DIGITAL CONVERTER

(71) Applicant: Tsinghua University, Beijing (CN)

(72) Inventors: Nan Sun, Beijing (CN); Jiaxin Liu, Beijing (CN)

(73) Assignee: Tsinghua University, Beijing (CN)

(*) Notice: Subject to any disclaimer, the term of this patent is extended or adjusted under 35 U.S.C. 154(b) by 116 days.

(21) Appl. No.: 17/385,605

(22) Filed: Jul. 26, 2021

(65) Prior Publication Data

US 2021/0359698 A1    Nov. 18, 2021

Related U.S. Application Data

(63) Continuation of application No. PCT/CN2020/071166, filed on Jan. 9, 2020.

(30) Foreign Application Priority Data

Dec. 27, 2019 (CN) .......................... 201911382808.X

(51) Int. Cl.
    *H03M 1/38* (2006.01)
(52) U.S. Cl.
    CPC ..................... *H03M 1/38* (2013.01)
(58) Field of Classification Search
    CPC ................................ H03M 1/38; H03M 1/403
    USPC ................ 341/155, 161, 144, 143, 172, 163
    See application file for complete search history.

(56) References Cited

U.S. PATENT DOCUMENTS

| 10,340,932 B2 | 7/2019 | Bandyopadhyay et al. |
| 10,417,460 B1 | 9/2019 | Youssefi |
| 2016/0226507 A1 | 8/2016 | Baek et al. |
| 2019/0123759 A1 | 4/2019 | Kumar et al. |

(Continued)

FOREIGN PATENT DOCUMENTS

| CN | 103618550 A | 3/2014 |
| CN | 105827245 A | 8/2016 |

(Continued)

OTHER PUBLICATIONS

International Search Report dated Jul. 1, 2021 for International Patent Application No. PCT/CN2020/071166.

(Continued)

*Primary Examiner* — Peguy Jean Pierre
(74) *Attorney, Agent, or Firm* — Womble Bond Dickinson (US) LLP

(57) ABSTRACT

The present application discloses a successive approximation register analog-to-digital converter with passive noise shaping, which comprises: switch capacitor arrays for acquiring analog input signals; a noise shaping circuit which is a passive integral network, the network has input ends connected respectively with output ends of the two switch capacitor arrays and for acquiring output signals of the two switch capacitor arrays, is composed of a plurality of sub passive integrators, and reconfigures the plurality of sub passive integrators to different circuit forms; a comparator which has two input ends connected respectively with output ends of the passive integral network and an output end connected with an input end of a logic circuit, and is configured to compare magnitudes of the output signals of the noise shaping circuit.

10 Claims, 5 Drawing Sheets

(56) References Cited

U.S. PATENT DOCUMENTS

| | | |
|---|---|---|
| 2019/0207620 A1 | 7/2019 | Lee et al. |
| 2019/0238150 A1 | 8/2019 | Eitan et al. |
| 2020/0228129 A1* | 7/2020 | Huang ................ H03M 1/0854 |

FOREIGN PATENT DOCUMENTS

| | | |
|---|---|---|
| CN | 108365847 A | 8/2018 |
| CN | 208768053 U | 4/2019 |
| CN | 110190849 A | 8/2019 |
| CN | 110474623 A | 11/2019 |
| CN | 110492885 A | 11/2019 |
| WO | 2017195911 A1 | 11/2017 |

OTHER PUBLICATIONS

Zhuang, Haoyu, et al., "A Second-Order Noise-Shaping SAR ADC With Passive Integrator and Tri-Level Voting," IEEE J. of Solid-State Circuits, vol. 54, No. 6, Jun. 2019.

Liangbo, Xie, et al.; "A low-power CMOS smart temperature sensor for RFID application" J. of Semicond., Nov. 2014, vol. 35, No. 11, Centre for RFIC and System Technology, School of Communication and Information Engineering, University of Electronic Science and Technology of China, Chengdu 611731, China.

* cited by examiner

PASSIVE NOISE-SHAPING SUCCESSIVE APPROXIMATION REGISTER ANALOG-TO-DIGITAL CONVERTER

CROSS-REFERENCE TO RELATED APPLICATIONS

This application is a continuation of International Application No. PCT/CN2020/071166, entitled "Passive Noise-Shaping Successive Approximation Register Analog-to-Digital Converter", filed on Jan. 9, 2020, which claims priority to Chinese Patent Application entitled "Successive Approximation Register Analog-to-Digital Converter with Passive Noise Shaping" filed by Tsinghua University on Dec. 27, 2019, with the Application No. 201911382808X. The disclosures of the aforementioned applications are hereby incorporated by reference in their entireties.

TECHNICAL FIELD

The present application belongs to the technical field of integrated circuit design, and particularly to a successive approximation register analog-to-digital converter with passive noise shaping.

BACKGROUND

An analog-to-digital converter (ADC) is an electronic device that can convert analog signals in the real world into digital signals in an electronic system. A successive approximation register (SAR) ADC for noise shaping is a high-precision ADC structure, which is widely used in fields such as the Internet of Things, wearable devices, implantable medical electronics and so on.

The core of a noise shaping SAR ADC is a noise shaping circuit. The function of the noise shaping circuit is to integrate and store conversion residues of the ADC, provide necessary gains, and add them to the signals on switch capacitor arrays. According to whether the circuit contains an active circuit such as an operational amplifier, the noise shaping SAR ADC may be classified into an active category and a passive category. The existing passive noise shaping SAR ADC mainly has the following two solutions.

A first solution is shown in FIG. 1. The noise shaping circuit portion contains two passive integrators, two gain stages and two adders. Functions of each module are described as follows: the passive integrators acquire conversion residues on switch capacitor arrays and integrate and store the conversion residues, wherein an integral signal stored on the passive integrator is Vint; the passive integrators adopt a principle of free charge exchange between capacitors to realize integration, and the signal Vint obtained by integration is attenuated, therefore, the signal needs to be amplified by the gain stages, and the amplified integral signal is G*Vint, where G is a gain of the gain stage; and finally, the signals Vin on the switch capacitor arrays and the amplified integral signal are added up by the adders, and an addition result is Vin+G*Vint and is output to two ends of a comparator.

The above solution has disadvantages that the noise shaping circuit is high in implementation complexity, poor in stability or high in power consumption, because both the gain stages and the adders need additional hardware overhead. If a dynamic amplifier is used to realize the gain stages, the dynamic amplifier is relatively complex in circuit structure and poor in stability. If a multi-input comparator is used to realize the gain stages and the adders, the multi-input comparator is very high in power consumption.

A second solution is shown in FIG. 2. The noise shaping circuit portion contains one residue acquisition circuit and two passive integrators. Functions of each module are described as follows: the residue acquisition circuit acquires conversion residues on the switch capacitor arrays and then transmits an acquired residue signal to the passive integrators; the passive integrators integrate and store the residue signal, and integral signals stored on the passive integrators are Vint; and the passive integrators are stacked between the switch capacitor arrays and the comparator, therefore, the signals on two ends of the comparator are Vin+2*Vint, that is, a gain of G=2 is obtained in such a stacking way.

The above solution 2 has a simpler circuit structure than the solution 1, but the solution 2 can only achieve twice the gain of the integral signal, and the noise shaping effect is poor, because the noise shaping effect depends on the gain. The greater the gain, the stronger the realizable shaping capacity. Furthermore, the residue acquisition circuit may introduce loud circuit noise, thereby further reducing the accuracy of the ADC.

SUMMARY

The present application is directed to solve one of the technical problems in the prior art to a certain extent.

Therefore, an objective of the present application is to provide a successive approximation register analog-to-digital converter with passive noise shaping. The analog-to-digital converter may amplify an integral signal without using an operational amplifier and a multi-input comparator, which is simple in structure and low in power consumption.

To achieve the above objective, an embodiment of the present application provides a successive approximation register analog-to-digital converter with passive noise shaping, which includes two switch capacitor arrays, a noise shaping circuit, a comparator and a logic circuit.

Input ends of the switch capacitor arrays acquire analog input signals.

The noise shaping circuit is a passive integral network. The passive integral network has input ends connected respectively with output ends of the two switch capacitor arrays and is configured to acquire output signals of the two switch capacitor arrays. The passive integral network is composed of a plurality of sub passive integrators. The plurality of sub passive integrators can be reconfigured to different circuit forms.

The comparator has two input ends connected respectively with output ends of the passive integral network, and an output end connected with an input end of the logic circuit. The comparator is configured to compare magnitudes of output signals of the noise shaping circuit and output a comparison result to the logic circuit.

The logic circuit has two output ends connected respectively with input ends of the two switch capacitor arrays, and another output end thereof outputs a digital output signal. The logic circuit is configured to output the digital output signal, process the comparison result to obtain a control signal and control output voltages of the two switch capacitor arrays according to the control signal.

The successive approximation register analog-to-digital converter with passive noise shaping of the present embodiment reconfigures the noise shaping circuit, thereby effectively utilizing hardware resources of the circuit, and realizing the passive noise shaping SAR ADC with low hardware cost. No dynamic amplifier or multi-input comparator is needed to realize the functions of gain and adders, so that the successive approximation register analog-to-digital converter with passive noise shaping has the advantages of simple circuit structure, good stability and low power consumption. Furthermore, the present solution may also realize any gain, and therefore may further realize strong noise shaping capacity.

Furthermore, the successive approximation register analog-to-digital converter with passive noise shaping according to the above embodiment of the present application may further have the following additional technical features:

Further, in an embodiment of the present application, the analog-to-digital converter includes a residue processing phase, a sampling phase and a conversion phase.

The passive integral network structure is transformed in the residue processing phase and the conversion phase.

Further, in an embodiment of the present application, in the residue processing phase, the plurality of sub passive integrators of the passive integral network are connected in parallel. The plurality of sub passive integrators that are connected in parallel have two input ends connected respectively with the output ends of the two switch capacitor arrays, and output ends disconnected from the comparator.

The passive integral network acquires a residue signal Vres of a previous cycle of the switch capacitor arrays for integration, and after the integration, the integral signal on each passive integrator is Vint.

Further, in an embodiment of the present application, in the sampling phase, the switch capacitor arrays acquire an analog input signal Vin. The passive integral network is in any circuit form.

Further, in an embodiment of the present application, in the conversion phase, the passive integral network is divided into two groups of a plurality of sub passive integrators that are connected in series. Each group of sub passive integrators has input ends connected with the output ends of the switch capacitor arrays, and an output end connected with an input end of the comparator.

Further, in an embodiment of the present application, in the conversion phase, the output signals of the switch capacitor arrays enter the noise shaping circuit and are integrated with the existing residue signal in the noise shaping circuit to output two signals to the comparator.

The comparator compares the magnitudes of the signals and outputs the comparison result to the logic circuit; the logic circuit processes the comparison result to obtain the control signal, and controls the two switch capacitor arrays respectively through the two signals; and the switch capacitor arrays adjust the output voltages according to the control signal; and the flow goes in cycle sequentially.

After the number of cycles reaches the number of bits of the switch capacitor arrays, the conversion phase is ended, and the logic circuit outputs the digital output signal.

Further, in an embodiment of the present application, the passive integral network is implemented by capacitors and switch devices.

Additional aspects and advantages of the present application are partially described below, and part of them may become apparent in the following description or may be known by the practice of the present application.

BRIEF DESCRIPTION OF THE DRAWINGS

The above and/or additional aspects and advantages of the present application become apparent and easily understood from the following description of the embodiments in combination with the accompanying drawings.

DETAILED DESCRIPTION

Figure 1:
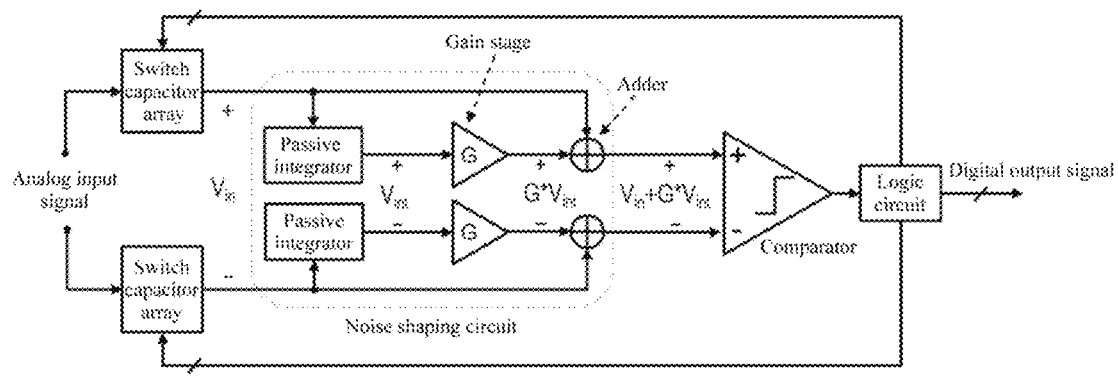
FIG. 1 is a structural block diagram of an existing first passive noise shaping SAR ADC.
Figure 2:
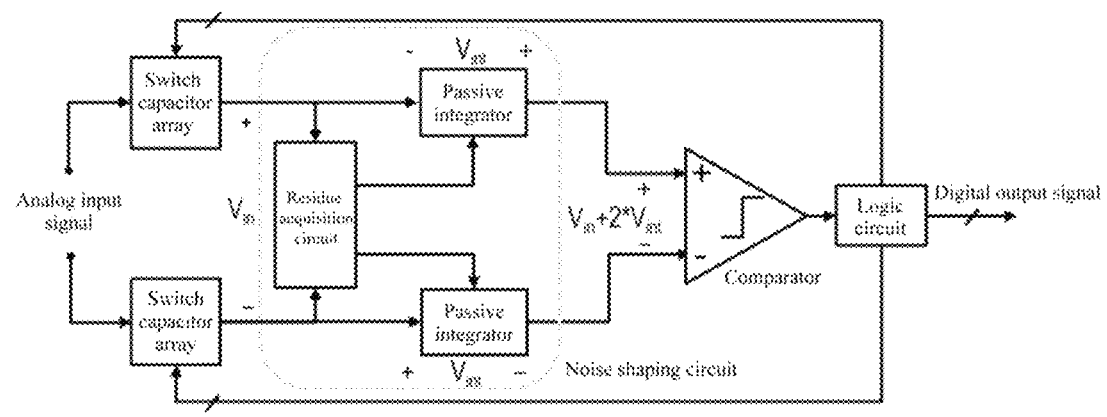
FIG. 2 is a structural block diagram of an existing second passive noise shaping SAR ADC.

Embodiments of the present application are described below in detail. Examples of the embodiments are shown in the accompanying drawings, wherein same or similar reference numerals indicate same or similar elements or elements having the same or similar functions. The embodiments described below with reference to the accompanying drawings are exemplary and are intended to explain the present application, but should not be construed as limiting the present application.

A successive approximation register analog-to-digital converter with passive noise shaping provided according to an embodiment of the present application is described below with reference to the accompanying drawings.

Figure 3:
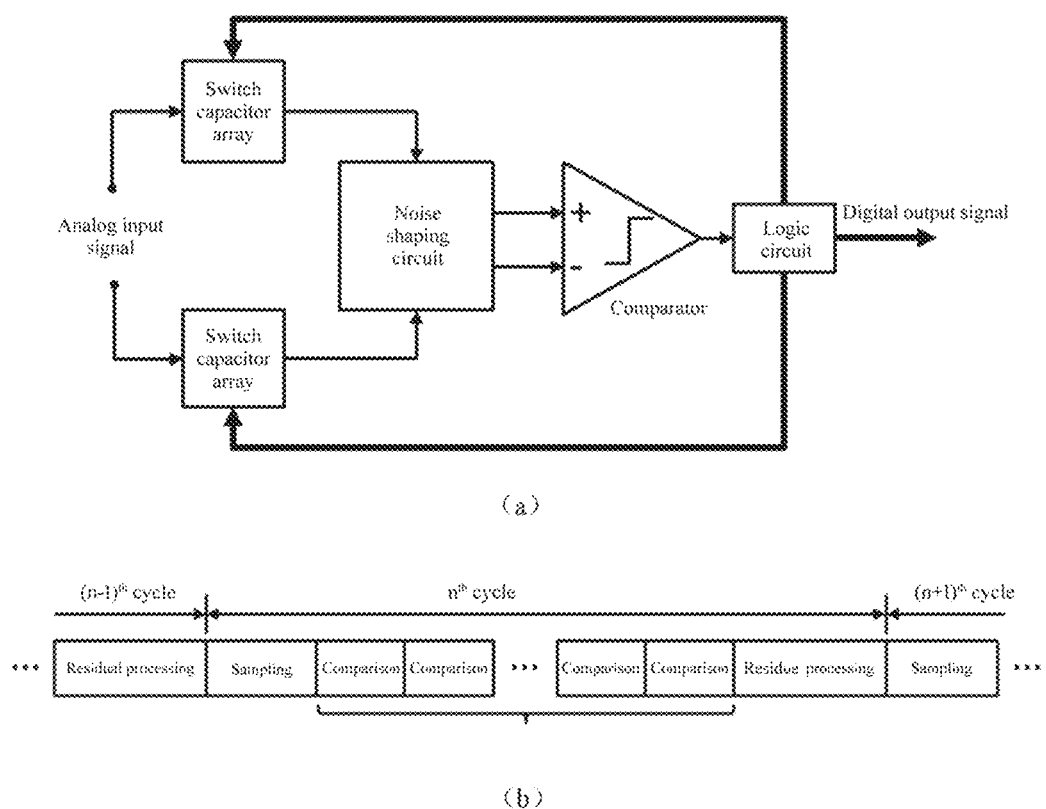
FIG. 3 is a structural schematic diagram of a noise SAR ADC according to an embodiment of the present application.

As shown in FIG. 3, a structure of a noise SAR ADC is shown in FIG. 3(a) and is mainly composed of two switch capacitor arrays, a noise shaping circuit, a comparator and a logic circuit. An operating cycle of the noise SAR ADC is composed of a sampling phase, a conversion phase and a residue processing phase. The conversion phase contains multiple comparison processes. Referring to FIG. 3(b), a working process is described as follows:

(1) In the residue processing phase: the noise shaping circuit processes residue signals remaining on the switch capacitor arrays, and a processing result is stored in the noise shaping circuit.

(2) In the sampling phase: the switch capacitor arrays acquire analog input signals.

(3) In the conversion phase: output signals of the switch capacitor arrays enter the noise shaping circuit and are integrated with the existing signal in the noise shaping circuit to output two signals to the comparator; the comparator compares magnitudes of the signals, and a comparison result enters the logic circuit; the logic circuit processes the comparison result and outputs two signals to control respectively the two switch capacitor arrays; the switch capacitor arrays adjust output voltages according to a control signal; and the flow goes in cycle sequentially; and when a number of cycles reaches a number of bits of the switch capacitor arrays, the conversion phase is ended.

The embodiment of the present application reconfigures the noise shaping circuit and designs a reconfigurable noise shaping SAR ADC, which can amplify the integral signal without using an operational amplifier and a multi-input comparator, so that the circuit complexity and power consumption may be greatly reduced.

Figure 4:
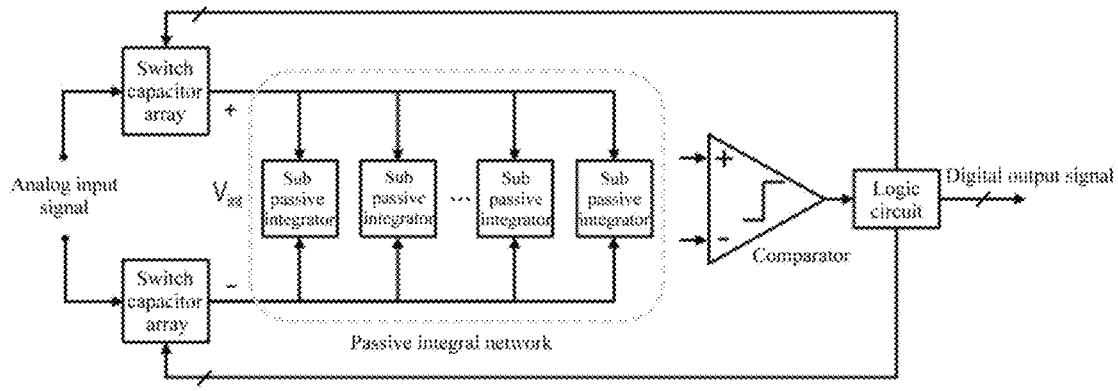
FIG. 4 is a circuit structural schematic diagram of a successive approximation register analog-to-digital converter with passive noise shaping in a residue processing phase according to an embodiment of the present application.

FIG. 4 is a circuit structural schematic diagram of a successive approximation register analog-to-digital converter with passive noise shaping in the residue processing phase according to an embodiment of the present application.

As shown in FIG. 4, the successive approximation register analog-to-digital converter with passive noise shaping includes two switch capacitor arrays, a noise shaping circuit, a comparator and a logic circuit.

Input ends of the switch capacitor arrays acquire the analog input signals.

The noise shaping circuit is a passive integral network; the passive integral network has input ends connected respectively with output ends of the two switch capacitor arrays and configured to acquire the output signals of the two switch capacitor arrays; the passive integral network is composed of a plurality of sub passive integrators; and the plurality of sub passive integrators are reconfigured to different circuit forms.

The comparator has two input ends connected respectively with output ends of the passive integral network; an output end connected with an input end of the logic circuit; and the comparator is configured to compare magnitudes of the output signals of the noise shaping circuit and output a comparison result to the logic circuit.

The logic circuit has two output ends connected respectively with the input ends of the two switch capacitor arrays, and another output end thereof outputs a digital output signal; and the logic circuit is configured to output the digital output signal and process the comparison result to obtain a control signal, and output voltages of the two switch capacitor arrays are controlled according to the control signal.

It may be understood that the passive integral network in the noise shaping circuit can be reconfigured in different phases of the analog-to-digital converter, so that different circuit functions may be realized, the structure is simple, and the power consumption is low.

FIG. 4 shows a residue processing phase of the successive approximation register analog-to-digital converter with passive noise shaping. In this phase, the passive integral network is in a form that a plurality of sub passive integrators are connected in parallel. The passive integral network is disconnected from the comparator, and at the same time, two input ends of the passive integral network are connected with the output ends of the two switch capacitor arrays to acquire the residue signals Vres of a previous cycle on the switch capacitor arrays for integration. After integration, each integral signal that is stored finally on each sub passive integrator is Vint.

Figure 5:
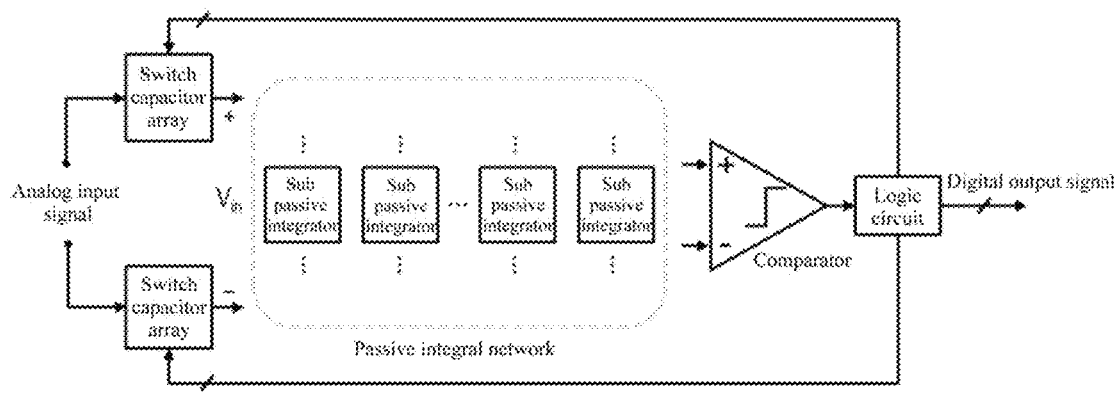
FIG. 5 is a circuit structural schematic diagram of the successive approximation register analog-to-digital converter with passive noise shaping in a sampling phase according to an embodiment of the present application.

FIG. 5 shows a sampling phase of the successive approximation register analog-to-digital converter with passive noise shaping. The switch capacitor arrays acquire the analog input signals Vin. In this phase, the passive integral network may be configured in any circuit form. Each sub passive integrator still retains the integral signal Vint obtained in the previous phase.

Figure 6:
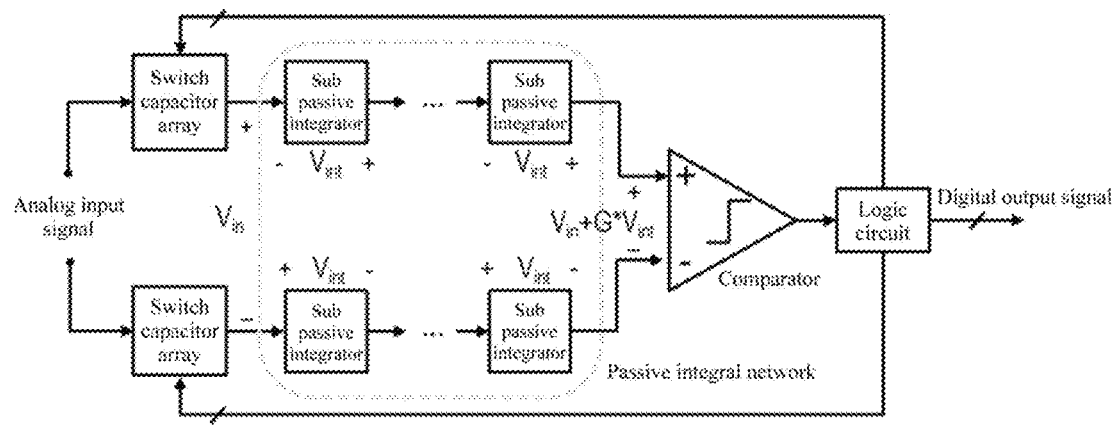
FIG. 6 is a circuit structural schematic diagram of the successive approximation register analog-to-digital converter with passive noise shaping in a conversion phase according to an embodiment of the present application.

FIG. 6 shows a conversion phase of the successive approximation register analog-to-digital converter with passive noise shaping. In this phase, the passive integral network is divided into two groups of structures that are connected in series. Each group is connected respectively between the output end of the switch capacitor array and one input end of the comparator. At this moment, each sub passive integrator still retains the integral signal Vint of the previous phase. Assuming that a total number of the sub passive integrators is G, the signals on two ends of the comparator are Vin+G*Vint, so that functions of gain and addition of G times are realized, and the gain stages and adders are realized without additional hardware overhead.

Further, in the conversion phase, the output signals of the switch capacitor arrays enter the noise shaping circuit and are integrated with the existing residue signal in the noise shaping circuit to output two signals to the comparator.

The comparator compares magnitudes of the signals and outputs a comparison result to the logic circuit; the logic circuit processes the comparison result to obtain the control signal, and controls the two switch capacitor arrays respectively through two signals; and the switch capacitor arrays adjust output voltages according to the control signal; and the flow goes in cycle sequentially.

After the number of cycles reaches the number of bits of the switch capacitor arrays, the conversion phase is ended, and the logic circuit outputs the digital output signal.

Further, in an embodiment of the present application, the passive integral network may be implemented by capacitors and switch devices.

Figure 7:
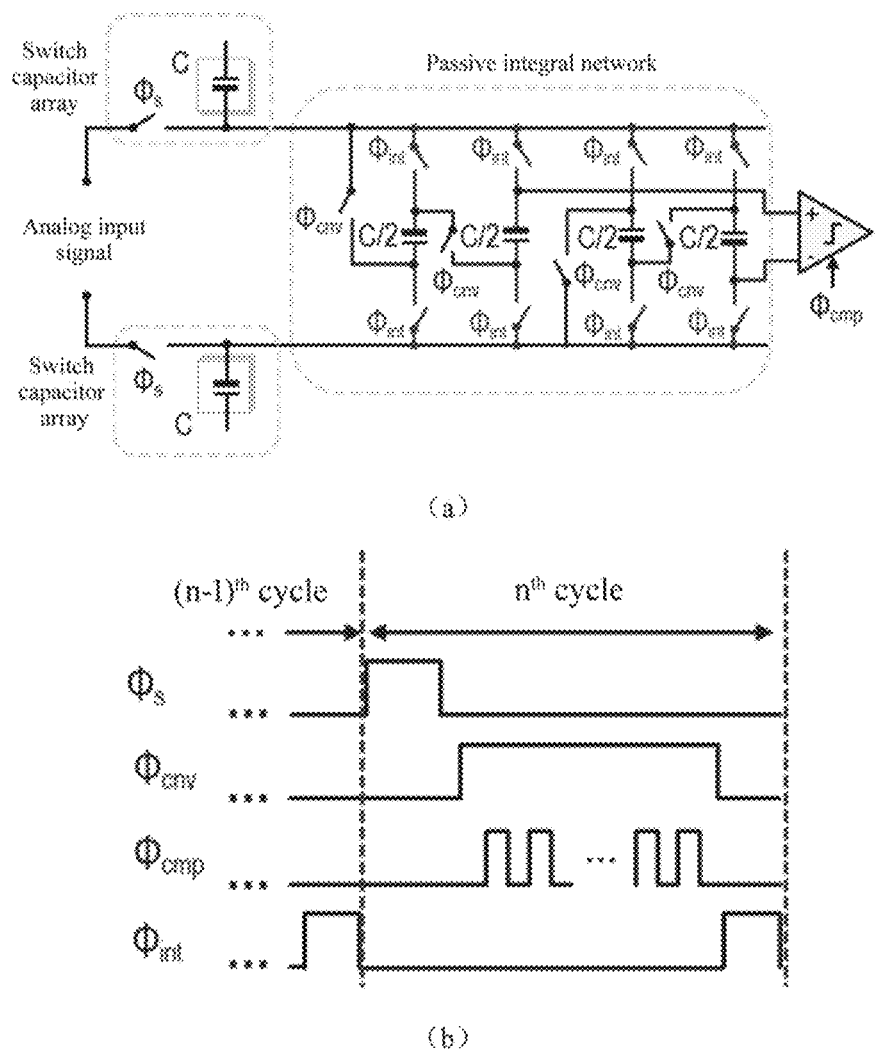
FIG. 7 is a schematic diagram of an implementation of the successive approximation register analog-to-digital converter with passive noise shaping according to an embodiment of the present application.

FIG. 7 is a schematic diagram of an implementation of the successive approximation register analog-to-digital converter with passive noise shaping. FIG. 7(a) is a circuit structural diagram. The circuit structure in FIG. 7 may realize a noise transfer function of $(1-0.8\ z^{-1})$. For simplicity, the logic circuit portion is omitted in the drawing. The passive integral network in the drawing has a total of four sub passive integrators. The sub passive integrators are implemented by capacitors. Connection and disconnection between devices are realized by a switch. A total capacitance value of each switch capacitor circuit is C, and a sub capacitance value in the passive integral network is C/2. A control time sequence of the switch is shown in FIG. 7(b). A high level of the control signal indicates that the switch is on, and a low level of the signal indicates that the switch is off.

Figure 8:
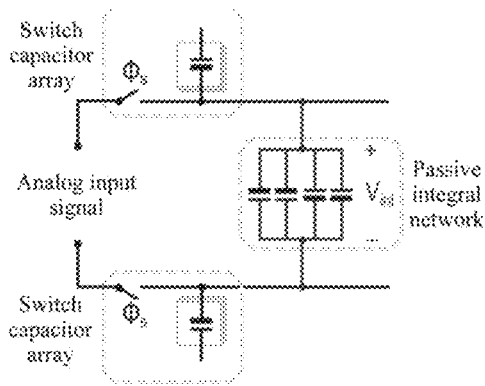
FIG. 8 is a schematic diagram of an equivalent circuit of a residue acquisition phase according to an embodiment of the present application.

As shown in FIG. 8, in the residue processing phase of an $(n-1)^{th}$ cycle, Φint is high, and Φs, Φcnv and Φcmp are low. At this moment, the comparator is in a standby state (omitted in the drawing). Four sub integral capacitors are connected in parallel and acquire the residue signal Vres(n−1) in the $(n-1)^{th}$ cycle from the switch capacitor circuit. The residue signal is a difference between the analog input signal and the digital output signal, i.e., $$Vres(n-1)=Vin(n-1)-Dout(n-1) \quad (1)$$

After the residue acquisition phase is ended, during an $n^{th}$ conversion cycle, the signal on the integral capacitor is as follows:

$$Vint(n)=0.8*Vint(n-1)+0.2*Vres(n-1) \quad (2)$$

Figure 9:
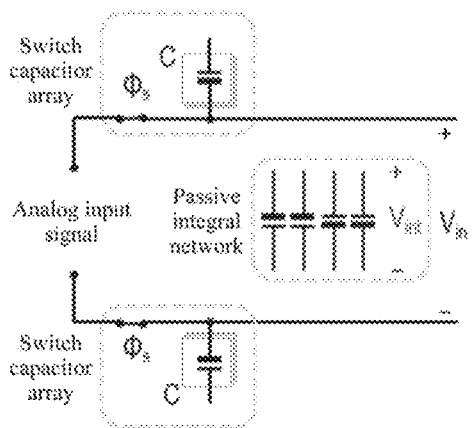
FIG. 9 is a schematic diagram of an equivalent circuit of the sampling phase according to an embodiment of the present application.

As shown in FIG. 9, in the sampling phase of the $n^{th}$ cycle, Φs is high, and Φint, Φcnv and Φcmp are low. At this moment, the comparator is still in the standby state (omitted in the drawing), and the passive integral network is disconnected from the switch capacitor arrays. Each sub integral capacitor still retains the integral signal Vint(n). Meanwhile, the switch capacitor arrays acquire an input signal Vin(n) of the $n^{th}$ cycle. The signal is stored on the switch capacitor arrays.

Figure 10:
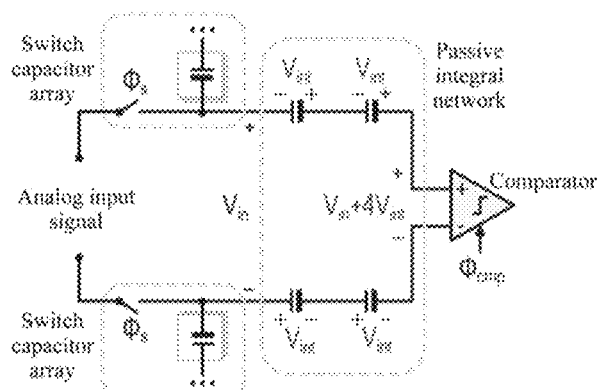
FIG. 10 is a schematic diagram of an equivalent circuit of the conversion phase according to an embodiment of the present application.

As shown in FIG. 10, in the conversion phase of the $n^{th}$ cycle, Φcnv is high, Φs and Φint are low, and Φcmp is a continuous pulse signal. At this moment, the comparator is activated to execute a comparison operation. The passive integral network is configured in a form where two groups of capacitors are connected in series and connected respectively between the output end of one switch capacitor array and one input end of the comparator. At this moment, the signals on both ends of the comparator are:

$$Vcmp(n)=Vin(n)+4Vint(n) \quad (3)$$

Through the comparison in multiple cycles, when the conversion phase is ended, the ADC converts Vcmp(n) to the digital output signal in the current cycle, which is:

$$Dout(n)=Vcmp(n)+Q(n) \quad (4)$$

In the formula, Q(n) is quantified noise introduced in the conversion phase of the $n^{th}$ cycle.

By combining the formulas (1)-(4), it may obtain:

$$Dout(n)=Vin(n)+Q(n)-0.8*Q(n-1) \quad (5)$$

The formula (5) is transformed from a time domain to z domain, and it may obtain:

$$Dout(z)=Vin(z)+(1-0.80Q(z) \quad (6)$$

Therefore, the $(1-0.8\ z^{-1})$ shaping of the quantified noise is realized.

The successive approximation register analog-to-digital converter with passive noise shaping provided according to the present embodiment reconfigures the noise shaping circuit, thereby effectively utilizing hardware resources of the circuit, and realizing the passive noise shaping SAR ADC with low hardware cost. No dynamic amplifier or multi-input comparator is needed to realize the functions of gain and adders, so that the successive approximation register analog-to-digital converter with passive noise shaping has the advantages of simple circuit structure, good stability and low power consumption. Furthermore, the present solution may also realize any gain, and may further realize strong noise shaping capacity.

In the description of the present application, it should be understood that an orientation or positional relationship indicated by terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. is based on the orientation or positional relationship shown in the drawings, and is only for convenience in describing the present application and simplifying the description, rather than indicating or implying specified devices or elements must have a specific orientation or must be constructed and operated in a specific orientation, and therefore cannot be understood as a limitation to the present application.

In addition, terms "first" and "second" are only for the purpose of description, and cannot be understood as indicating or implying relative importance or implicitly indicating the number of indicated technical features. Therefore, features defined with "first" and "second" may explicitly or implicitly include at least one of the features. In the description of the present application, "a plurality of" means at least two, for example, two or three, etc., unless otherwise specified.

In the present application, unless otherwise defined and limited clearly, the terms "mount", "connected", "connection" and "fixed" should be understood in a broad sense, for example, it may be a fixed connection, a detachable connection, or an integral connection; it may be a mechanical connection or an electrical connection; and it may be a direct connection or an indirect connection through an intermediate medium, and may also be an internal communication of two elements or an interaction relationship of two elements, unless otherwise specified. For those ordinarily skilled in the art, the specific meaning of the above terms in the present application may be understood in specific circumstances.

In the present application, unless otherwise specified or defined clearly, the first feature is "on" or "under" the second feature, which may refer to that the first feature and the second feature are in direct contact, or the first feature and the second feature are in indirect contact through an intermediate medium. Moreover, the first feature is "on" and "above" the second feature, which may refer to that the first feature is directly above or obliquely above the second feature, or only refers to that a level of the first feature is higher than the second feature. Moreover, the first feature is "below" and "under" the second feature, which may refer to that the first feature is directly below or obliquely below the second feature, or only refers to that the level of the first feature is lower than the second feature.

In the description of the present application, descriptions with reference to terms "one embodiment", "some embodiments", "examples", "specific examples", or "some examples" etc. mean specific features, structures, materials, or characteristics described in conjunction with the embodiment(s) or example(s) are contained in at least one embodiment or example of the present application. In the present specification, the schematic representations of the above terms are not necessary for the same embodiment(s) or example(s). Moreover, the described specific features, structures, materials or characteristics may be combined in an appropriate way in any or more embodiments or examples. Furthermore, different embodiments or examples and features of different embodiments or examples described in the present specification may be combined by those skilled in the art without contradicting each other.

Although the embodiments of the present application have been shown and described above, it may be understood that the above embodiments are exemplary and should not be construed as limiting the present application. Changes, modifications, replacements or variations may be made by those skilled in the art for the above embodiments within the scope of the present application.

What is claimed is:

1. A successive approximation register analog-to-digital converter with passive noise shaping, comprising:
two switch capacitor arrays, a noise shaping circuit, a comparator, and a logic circuit, wherein
the switch capacitor arrays have input ends configured to acquire analog input signals;
wherein the noise shaping circuit is a passive integral network, the passive integral network has input ends connected respectively with output ends of the two switch capacitor arrays and configured to acquire output signals of the two switch capacitor arrays, the passive integral network is composed of a plurality of sub passive integrators, and the plurality of sub passive integrators are reconfigurable to different circuit forms;

the comparator has two input ends connected respectively with output ends of the passive integral network and an output end connected with an input end of the logic circuit, and the comparator is configured to compare magnitudes of output signals of the noise shaping circuit and output a comparison result to the logic circuit;

the logic circuit has two output ends connected respectively with the input ends of the two switch capacitor arrays and another output end configured to output a digital output signal, the logic circuit is configured to output the digital output signal and process the comparison result to obtain a control signal, and output voltages of the two switch capacitor arrays are controllable according to the control signal;

wherein the analog-to-digital converter includes a residue processing phase, a sampling phase, and a conversion phase; and in the residue processing phase, the plurality of sub passive integrators of the passive integral network are connected in parallel, the plurality of sub passive integrators that are connected in parallel have two input ends connected respectively to the output ends of the two switch capacitor arrays, and have output ends disconnected from the comparator; and the passive integral network is configured to acquire a residue signal Vres of a previous cycle of the switch capacitor arrays for integration.

2. The successive approximation register analog-to-digital converter with passive noise shaping according to claim 1, wherein in the sampling phase, the switch capacitor arrays acquire an analog input signal Vin, and the passive integral network is in any circuit form.

3. The successive approximation register analog-to-digital converter with passive noise shaping according to claim 1, wherein in the conversion phase, the passive integral network is divided into two groups of sub passive integrators that are connected in series, each group of sub passive integrators has input ends connected with the output ends of the switch capacitor arrays and an output end connected with one input end of the comparator.

4. The successive approximation register analog-to-digital converter with passive noise shaping according to claim 3, wherein in the conversion phase, the output signals of the switch capacitor arrays enter the noise shaping circuit, and are integrated with an existing residue signal in the noise shaping circuit to output two signals to the comparator;

a flow goes in cycle sequentially, in which the comparator compares magnitudes of the signals and outputs a comparison result to the logic circuit, the logic circuit processes the comparison result to obtain the control signal and control the two switch capacitor arrays respectively through two branches of the control signal, and the switch capacitor arrays adjust the output voltages according to the control signal; and responsive to a number of the cycle reaching a number of bits of the switch capacitor arrays, the conversion phase is ended, and the logic circuit outputs the digital output signal.

5. The successive approximation register analog-to-digital converter with passive noise shaping according to claim 1, wherein the passive integral network is implemented by capacitors and switch devices.

6. A successive approximation register analog-to-digital converter with passive noise shaping, comprising:

two switch capacitor arrays, a noise shaping circuit, a comparator, and a logic circuit, wherein the switch capacitor arrays have input ends configured to acquire analog input signals;

wherein the noise shaping circuit is a passive integral network, the passive integral network has input ends connected respectively with output ends of the two switch capacitor arrays and configured to acquire output signals of the two switch capacitor arrays, the passive integral network is composed of a plurality of sub passive integrators, and the plurality of sub passive integrators are reconfigurable to different circuit forms;

the comparator has two input ends connected respectively with output ends of the passive integral network and an output end connected with an input end of the logic circuit, and the comparator is configured to compare magnitudes of output signals of the noise shaping circuit and output a comparison result to the logic circuit;

the logic circuit has two output ends connected respectively with the input ends of the two switch capacitor arrays and another output end configured to output a digital output signal, the logic circuit is configured to output the digital output signal and process the comparison result to obtain a control signal, and output voltages of the two switch capacitor arrays are controllable according to the control signal;

wherein the analog-to-digital converter includes a residue processing phase, a sampling phase, and a conversion phase; and in the conversion phase, the passive integral network is divided into two groups of sub passive integrators that are connected in series, each group of sub passive integrators has input ends connected with the output ends of the switch capacitor arrays and an output end connected with one input end of the comparator.

7. The successive approximation register analog-to-digital converter with passive noise shaping according to claim 6, wherein in the residue processing phase, the plurality of sub passive integrators of the passive integral network are connected in parallel, the plurality of sub passive integrators that are connected in parallel have two input ends connected respectively to the output ends of the two switch capacitor arrays, and have output ends disconnected from the comparator; and the passive integral network is configured to acquire a residue signal Vres of a previous cycle of the switch capacitor arrays for integration.

8. The successive approximation register analog-to-digital converter with passive noise shaping according to claim 6, wherein in the sampling phase, the switch capacitor arrays acquire an analog input signal Vin, and the passive integral network is in any circuit form.

9. The successive approximation register analog-to-digital converter with passive noise shaping according to claim 6, wherein in the conversion phase, the output signals of the switch capacitor arrays enter the noise shaping circuit, and are integrated with an existing residue signal in the noise shaping circuit to output two signals to the comparator;

a flow goes in cycle sequentially, in which the comparator compares magnitudes of the signals and outputs a comparison result to the logic circuit, the logic circuit processes the comparison result to obtain the control signal and control the two switch capacitor arrays respectively through two branches of the control signal, and the switch capacitor arrays adjust the output voltages according to the control signal; and responsive to a number of the cycle reaching a number of bits of the switch capacitor arrays, the conversion phase is ended, and the logic circuit outputs the digital output signal.

10. The successive approximation register analog-to-digital converter with passive noise shaping according to claim 6, wherein the passive integral network is implemented by capacitors and switch devices.

* * * * *